US010236517B2

(12) United States Patent
Kamepalli et al.

(10) Patent No.: US 10,236,517 B2
(45) Date of Patent: Mar. 19, 2019

(54) METHOD FOR MANUFACTURING AND CLEANING A STAINLESS STEEL FUEL CELL BIPOLAR PLATE

(71) Applicant: GM GLOBAL TECHNOLOGY OPERATIONS LLC, Detroit, MI (US)

(72) Inventors: Smuruthi Kamepalli, Rochester, MI (US); Balasubramanian Lakshmanan, Rochester Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 15/678,695

(22) Filed: Aug. 16, 2017

(65) Prior Publication Data

US 2019/0058200 A1 Feb. 21, 2019

(51) Int. Cl.
| | |
|---|---|
| *C23C 16/40* | (2006.01) |
| *H01M 8/021* | (2016.01) |
| *C23C 16/46* | (2006.01) |
| *C23C 16/455* | (2006.01) |
| *C23C 16/52* | (2006.01) |
| *H01M 8/1018* | (2016.01) |

(52) U.S. Cl.
CPC ........... *H01M 8/021* (2013.01); *C23C 16/455* (2013.01); *C23C 16/46* (2013.01); *C23C 16/52* (2013.01); *H01M 2008/1095* (2013.01)

(58) Field of Classification Search
CPC .......... C23C 16/06; C23C 16/22; C23C 16/40
See application file for complete search history.

(56) References Cited

U.S. PATENT DOCUMENTS

| | | | | |
|---|---|---|---|---|
| 3,615,956 A | | 10/1971 | Irving et al. | |
| 4,400,408 A | * | 8/1983 | Asano | B22F 7/04 |
| | | | | 219/121.16 |
| 4,670,411 A | * | 6/1987 | Johnson | B01J 27/12 |
| | | | | 502/224 |
| 5,919,531 A | * | 7/1999 | Arkles | C23C 16/08 |
| | | | | 257/E21.584 |

(Continued)

FOREIGN PATENT DOCUMENTS

| | | | |
|---|---|---|---|
| JP | 2003-297379 | * | 10/2003 |
| JP | 2011-105976 | * | 6/2011 |

OTHER PUBLICATIONS

Parkin, Ivan P., et al., "Solid-State Routes to Tantalum Nitrides (TaN, Ta3N5)". Advanced Materials, 1994, 6, No. 10, 780-782.*

(Continued)

*Primary Examiner* — Bret P Chen

(57) ABSTRACT

A method for manufacturing a coated metal substrate includes the steps of: (1) inserting a substrate with a chromium(III) oxide layer inside a CVD chamber; (2) heating the substrate to a temperature which falls in the range of 400 to 500 degrees Celsius; (3) transporting gaseous nitrogen ($N_2$) and tantalum chloride (TaCl5) into the CVD chamber for at least two cycles; (4) ceasing the transportation of tantalum chloride (TaCl5) while nitrogen continues to flow from the inlet to the outlet; (5) reacting the tantalum chloride and the chromium(III) oxide and creating by-products; and (6) vacuuming the by-product matter from the CVD chamber via the flowing nitrogen gas.

4 Claims, 3 Drawing Sheets

(56) References Cited

U.S. PATENT DOCUMENTS

| | | | | |
|---|---|---|---|---|
| 6,197,683 | B1* | 3/2001 | Kang | C23C 16/34 |
| | | | | 204/192.17 |
| 6,410,433 | B1* | 6/2002 | Hautala | C23C 16/34 |
| | | | | 257/E21.17 |
| 6,548,453 | B1* | 4/2003 | Narasimhan | B05D 5/08 |
| | | | | 508/106 |
| 8,029,943 | B2 | 10/2011 | Vyas et al. | |
| 2001/0034097 | A1* | 10/2001 | Lim | C23C 16/34 |
| | | | | 438/253 |
| 2002/0182320 | A1* | 12/2002 | Leskela | C23C 16/34 |
| | | | | 427/250 |
| 2005/0019649 | A1 | 1/2005 | Kakutani et al. | |
| 2005/0202171 | A1* | 9/2005 | Shin | C23C 16/34 |
| | | | | 427/248.1 |
| 2006/0040148 | A1 | 2/2006 | Blunk et al. | |
| 2008/0152957 | A1 | 6/2008 | James et al. | |
| 2008/0213663 | A1 | 9/2008 | Hu et al. | |
| 2014/0303412 | A1* | 10/2014 | Karube | C07C 17/206 |
| | | | | 570/160 |
| 2015/0155569 | A1* | 6/2015 | Tezuka | H01M 4/9016 |
| | | | | 429/482 |

OTHER PUBLICATIONS

Cardarelli, Francois, et al., "Tantalum Protective Thin Coating Techniques for the Chemical Process Industry: Molten Salts Electrocoating as a New Alternative". Int. J. of Refractory Metals & Hard Materials 14 (1996) 365-381.*

Levy, Roland A., "Investigation of Chemically Vapor Deposited Tantalum for Medium Caliber Gun Barrel Protection". SERDP Project WP-1425, Oct. 2008, pp. 1-35.*

* cited by examiner

METHOD FOR MANUFACTURING AND CLEANING A STAINLESS STEEL FUEL CELL BIPOLAR PLATE

TECHNICAL FIELD

The present disclosure relates to stainless steel substrates, and in particular, a manufacturing system and method to remove oxides and other contaminants on a stainless steel substrate in a fuel cell bipolar plate manufacturing process.

BACKGROUND

Fuel cells are used as an electrical power source in many applications. In particular, fuel cells are proposed for use in automobiles to replace internal combustion engines. A commonly used fuel cell design uses a solid polymer electrolyte ("SPE") membrane or proton exchange membrane ("PEM"), to provide ion transport between the anode and cathode.

Fuel cells in general are an electrochemical device that converts the chemical energy of a fuel (hydrogen, methanol, etc.) and an oxidant (air or pure oxygen) in the presence of a catalyst into electricity, heat and water. Fuel cells produce clean energy throughout the electrochemical conversion of the fuel. Therefore, they are environmentally friendly because of the zero or very low emissions. Moreover, fuel cells are high power generating system from a few watts to hundreds of kilowatt with efficiencies much higher than a conventional internal combustion engine. Fuel cells also have low noise production because of few moving parts.

In proton exchange membrane type fuel cells, hydrogen is supplied to the anode as fuel and oxygen is supplied to the cathode as the oxidant. The oxygen can either be in pure form ($O_2$) or air (a mixture of $O_2$ and $N_2$). PEM fuel cells typically have a membrane electrode assembly ("MEA") in which a solid polymer membrane has an anode catalyst on one face, and a cathode catalyst on the opposite face. The anode and cathode layers of a typical PEM fuel cell are formed of porous conductive materials, such as woven graphite, graphitized sheets, or carbon paper to enable the fuel to disperse over the surface of the membrane facing the fuel supply electrode, Each electrode has finely divided catalyst particles (for example, platinum particles), supported on carbon particles, to promote oxidation of hydrogen at the anode and reduction of oxygen at the cathode. Protons flow from the anode through the ionically conductive polymer membrane to the cathode where they combine with oxygen to form water, which is discharged from the cell. The MEA is sandwiched between a pair of porous gas diffusion layers ("GDL"), which in turn are sandwiched between a pair of non-porous, electrically conductive elements or plates (i.e., flow field plates). The plates function as current collectors for the anode and the cathode, and contain appropriate channels and openings formed therein for distributing the fuel cell's gaseous reactants over the surface of respective anode and cathode catalysts. In order to produce electricity efficiently, the polymer electrolyte membrane of a PEM fuel cell must be thin, chemically stable, proton transmissive, non-electrically conductive and gas impermeable. In typical applications, fuel cells are provided in arrays of many individual fuel cell stacks in order to provide high levels of electrical power.

The electrically conductive plates currently used in fuel cells provide a number of opportunities for improving fuel cell performance, For example, these metallic plates typically include a passive oxide film on their surfaces wherein the electrically conductive coatings should be thin enough to minimize the contact resistance. Such electrically conductive coatings include gold and polymeric carbon coatings. The electrically conductive coating is applied to bipolar plates in a fuel cell in order to reduce or prevent corrosion during operation.

However, in order to have coatings which best adhere to the stainless steel substrate, the native oxide layer must be removed from the stainless steel substrate prior to coating the substrate. In a chemical vacuum deposition process, various coatings are applied to the stainless steel substrates in a single CVD chamber. However, current methods remove the oxide layer on stainless steel outside of the chemical vapor deposition via an acid bath and the like. Unfortunately, as soon as the stainless steel substrate is exposed to air after the acid bath, an oxide layer forms on the stainless steel substrate. Therefore, current methods which implement acid baths to clean the stainless steel substrate require that the stainless steel substrate be exposed to air prior to insertion into the CVD chamber thereby causing an oxide film to form.

Accordingly, there is a need for a manufacturing method and system to remove and coat the native oxide layer from the stainless steel substrate in a manner which does not expose the stainless steel substrate to air after oxide layer removal and prior to coating the stainless steel substrate.

SUMMARY

The present disclosure provides for a manufacturing method and system for cleaning a stainless steel substrate and applying a corrosion resistant coating onto a stainless steel substrate in a single chemical vacuum deposition ("CVD") chamber.

In one embodiment, the manufacturing method for manufacturing a coated substrate may include the steps of: (1) inserting a substrate with a chromium(III) oxide layer inside a CVD chamber; (2) heating the substrate to a temperature which falls in the range of 400 to 500 degrees Celsius; (3) transporting gaseous nitrogen ($N_2$) and tantalum chloride ($TaCl_5$) into the CVD chamber for at least two cycles; (4) ceasing the transportation of tantalum chloride ($TaCl_5$) while nitrogen gas ($N_2$) continues to flow from the inlet to the outlet; (5) reacting the tantalum chloride and the chromium (III) oxide and creating by-products; (6) vacuuming the by-product matter from the CVD chamber the flowing $N_2$; (7) adjusting the temperature in the CVD; (8) transporting reactant gases for coating the stainless steel substrate into the CVD chamber; (8) allowing the surface reaction of the reactant gases on the stainless steel substrate thereby creating coating byproducts; (9) removing the coating byproducts from the chamber via a CVD outlet which is in fluid communication with a vacuum.

In another embodiment, it is understood that the method of manufacture may only include the steps of: (1) inserting a stainless steel substrate with a chromium(III) oxide layer inside a CVD chamber; (2) heating the stainless steel substrate to a temperature which falls in the range of about 400 to about 500 degrees Celsius; (3) transporting gaseous nitrogen (N2) and tantalum chloride (TaCl5) into the CVD chamber for at least two cycles; (5) ceasing the transportation of tantalum chloride (TaCl5) while nitrogen continues to flow from the inlet to the outlet; (6) reacting the tantalum chloride and the chromium(III) oxide and creating by-products; and (7) vacuuming the by-product matter from the CVD chamber the flowing N2.

The present disclosure also provides for a system for manufacturing a stainless steel substrate 10 such that the system may include: a CVD chamber operatively configured to receive a stainless steel substrate; a heat source and a temperature sensor, a control module, a tantalum chloride tank and a coating reactant tank. The heat source and the temperature sensor may be disposed within the CVD chamber. The control module may be in communication with the heat source and the temperature sensor. The tantalum chloride tank and the coating reactant tank may be in fluid communication with the CVD chamber. The tantalum chloride tank and the coating reactant tank may also be in communication with the control module.

The present disclosure and its particular features and advantages will become more apparent from the following detailed description considered with reference to the accompanying drawings.

BRIEF DESCRIPTION OF THE DRAWINGS

These and other features and advantages of the present disclosure will be apparent from the following detailed description, best mode, claims, and accompanying drawings in which:

Like reference numerals refer to like parts throughout the description of several views of the drawings.

DETAILED DESCRIPTION

Figure 1A:
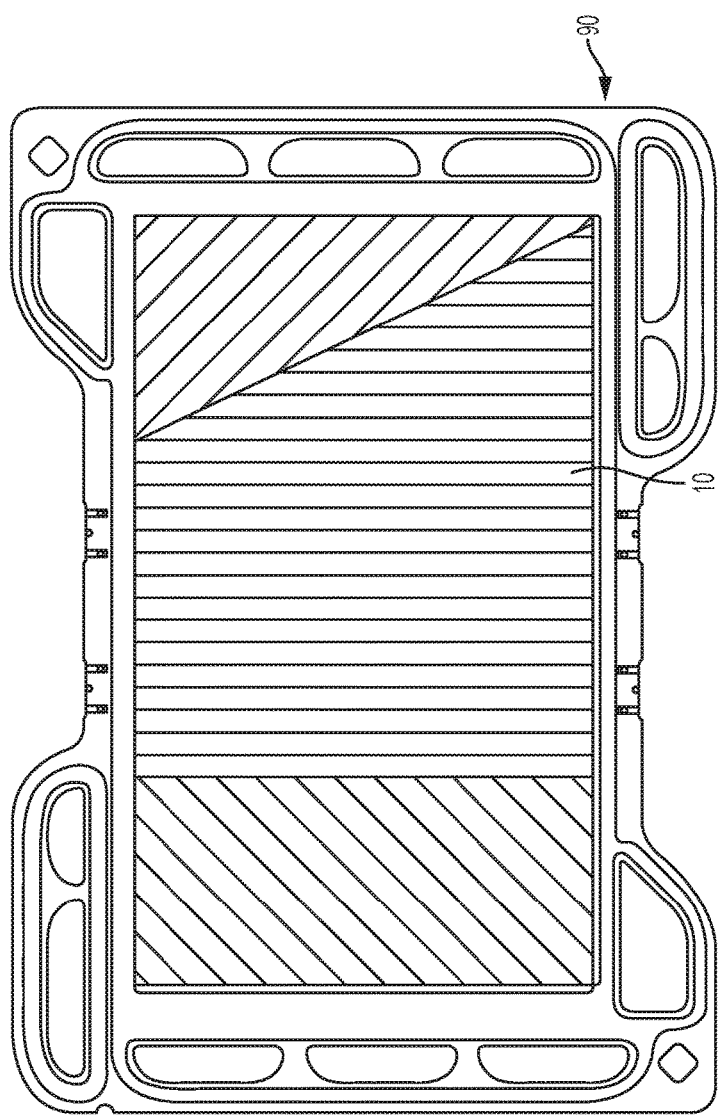
FIG. 1A is a top view of a bipolar plate used in a fuel cell.

Reference will now be made in detail to presently preferred compositions, embodiments and methods of the present disclosure, which constitute the best modes of practicing the present disclosure presently known to the inventors, The figures are not necessarily to scale. However, it is to be understood that the disclosed embodiments are merely exemplary of the present disclosure that may be embodied in various and alternative forms. Therefore, specific details disclosed herein are not to be interpreted as limiting, but merely as a representative basis for any aspect of the present disclosure and/or as a representative basis for teaching one skilled in the art to variously employ the present disclosure.

Except in the examples, or where otherwise expressly indicated, all numerical quantities in this description indicating amounts of material or conditions of reaction and/or use are to be understood as modified by the word "about" in describing the broadest scope of the present disclosure. Practice within the numerical limits stated is generally preferred. Also, unless expressly stated to the contrary: percent, "parts of," and ratio values are by weight; the description of a group or class of materials as suitable or preferred for a given purpose in connection with the present disclosure implies that mixtures of any two or more of the members of the group or class are equally suitable or preferred; the first definition of an acronym or other abbreviation applies to all subsequent uses herein of the same abbreviation and applies mutatis mutandis to normal grammatical variations of the initially defined abbreviation; and, unless expressly stated to the contrary, measurement of a property is determined by the same technique as previously or later referenced for the same property.

It is also to be understood that this present disclosure is not limited to the specific embodiments and methods described below, as specific components and/or conditions may, of course, vary. Furthermore, the terminology used herein is used only for the purpose of describing particular embodiments of the present disclosure and is not intended to be limiting in any way.

It must also be noted that, as used in the specification and the appended claims, the singular form "a," "an," and "the" comprise plural referents unless the context clearly indicates otherwise. For example, reference to a component in the singular is intended to comprise a plurality of components.

The term "comprising" is synonymous with "including," "having," "containing," or "characterized by." These terms are inclusive and open-ended and do not exclude additional, unrecited elements or method steps.

The phrase "consisting of" excludes any element, step, or ingredient not specified in the claim. When this phrase appears in a clause of the body of a claim, rather than immediately following the preamble, it limits only the element set forth in that clause; other elements are not excluded from the claim as a whole.

The phrase "consisting essentially of" limits the scope of a claim to the specified materials or steps, plus those that do not materially affect the basic and novel characteristic(s) of the claimed subject matter.

The terms "comprising", "consisting of", and "consisting essentially of" can be alternatively used. Where one of these three terms is used, the presently disclosed and claimed subject matter can include the use of either of the other two terms.

Throughout this application, where publications are referenced, the disclosures of these publications in their entireties are hereby incorporated by reference into this application to more fully describe the state of the art to which this present disclosure pertains.

The following detailed description is merely exemplary in nature and is not intended to limit the present disclosure or the application and uses of the present disclosure. Furthermore, there is no intention to be bound by any theory presented in the preceding background or the following detailed description.

Stainless steel has a relatively low cost with high electrical and thermal conductivity, good mechanical properties, and ease of machining. Moreover, stainless steel bi-polar plates may be quickly manufactured in high volumes using a stamping process before or after the (stainless steel) substrate 10 is coated.

Figure 1B:
FIG. 1B is a schematic side view of the stainless steel substrate of FIG. 1 (bipolar plate) having a native oxide layer.

The present disclosure provides, in part, a manufacturing method 12 (shown in FIG. 3) to remove an oxide layer 92 on a stainless steel substrate 10 as shown in FIG. 1B. The stainless steel substrate 10 may, but not necessarily, be a bipolar fuel cell plate 90 as shown in FIG. 1A. Metal Bipolar plates 90 used in fuel cells generally include a coating to prevent corrosion. However, in order for the coating to properly adhere to the bipolar plate 90 the native oxide layer 92 (FIG. 1B) must be removed prior to coating using coating reactants such as, but not necessarily, $TiCl_4$ and $NH_3$. It is understood that the oxide layer 92 may have a thickness 94 of about 10 nm to 30 nm. While there are many different ways to remove/clean the oxide layer 92 from a stainless steel substrate 10 outside of a chemical vapor deposition chamber (CVD chamber 34) 34, (FIG. 2), these methods still expose the stainless steel substrate 10 to the air 59 thereby causing another oxide layer 92 to form on the stainless steel substrate 10—just prior to inserting the stainless steel substrate 10 in the CVD chamber 34.

Figure 3:
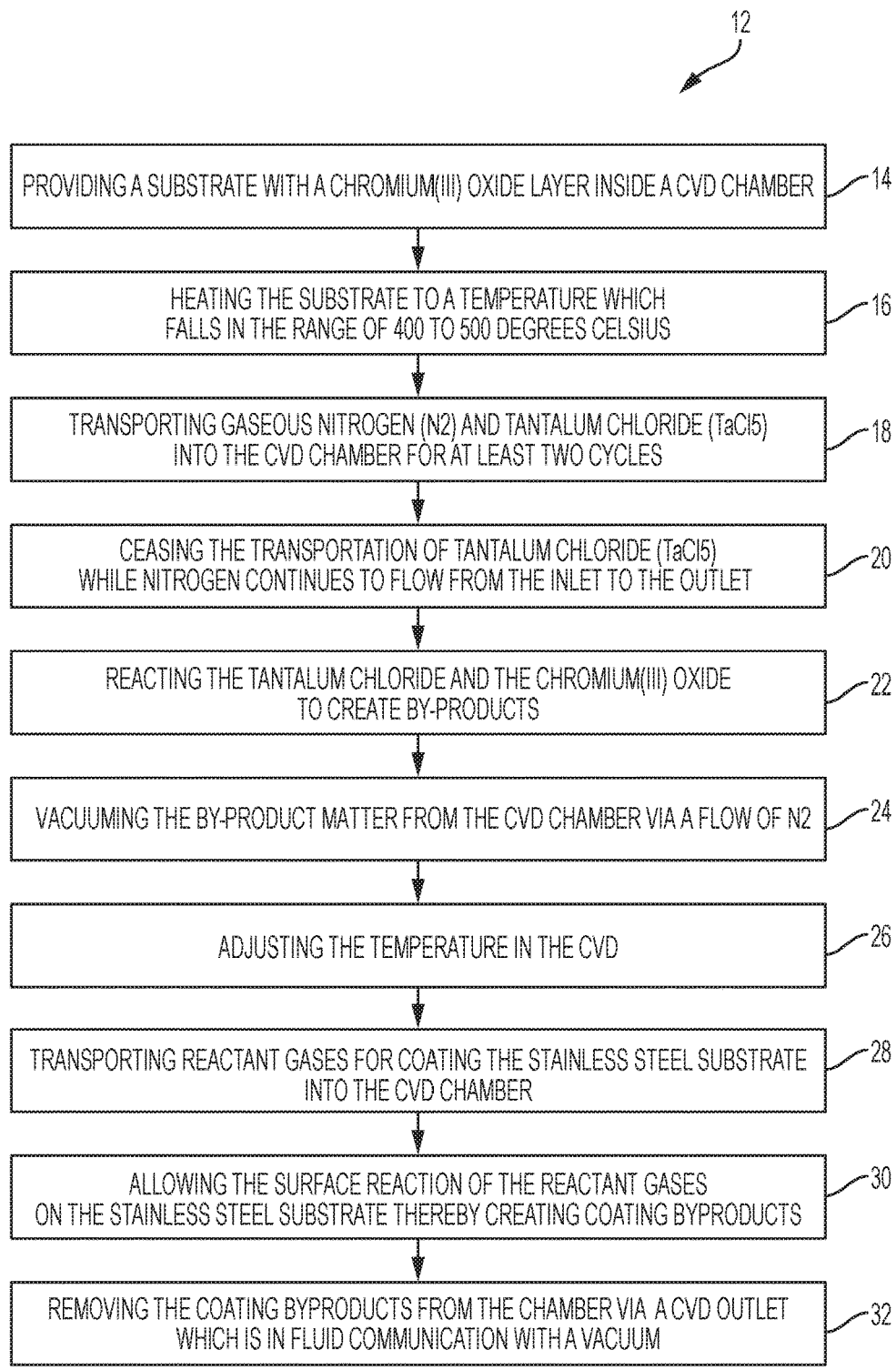
FIG. 3 is a flowchart which illustrates an example, non-limiting method of manufacture for the present disclosure.

Accordingly, as shown in FIG. 3, the present disclosure provides a method 12 which cleans and coats a stainless steel substrate in a single chemical vapor deposition chamber. As shown in FIG. 3, an example, non-limiting embodiment for the manufacturing method 12 to clean and coat a stainless steel substrate includes the steps of: (1) inserting a substrate with a chromium(III) oxide layer inside a CVD chamber; 14 (2) heating the substrate to a temperature which falls in the range of 400 to 500 degrees Celsius; 16 (3) transporting gaseous nitrogen (N2) and tantalum chloride (TaCl5) into the CVD chamber for at least two cycles; 18 (4) ceasing the transportation of tantalum chloride (TaCl5) while nitrogen continues to flow from the inlet to the outlet; 20 (5) reacting the tantalum chloride and the chromium(III) oxide and creating by-products; 22 (6) vacuuming the by-product matter from the CVD chamber the flowing N2; 24 (7) adjusting the temperature in the CVD; 26 (8) transporting reactant gases for coating the stainless steel substrate into the CVD chamber; 28 (9) allowing the surface reaction of the reactant gases on the stainless steel substrate thereby creating coating byproducts; 30 and (10) removing the coating byproducts from the chamber via a CVD outlet which is in fluid communication with a vacuum. 32

In another embodiment, it is understood that the method 12 of manufacture may only include the steps of: (1) inserting a stainless steel substrate with a chromium(III) oxide layer inside a CVD chamber 14; (2) heating the stainless steel substrate to a temperature which falls in the range of about 400 to about 500 degrees Celsius; 16 (3) transporting gaseous nitrogen (N2) and tantalum chloride (TaCl5) into the CVD chamber for at least two cycles; 18 (5) ceasing the transportation of tantalum chloride (TaCl5) while nitrogen continues to flow from the inlet to the outlet; 20 (6) reacting the tantalum chloride and the chromium(III) oxide and creating by-products; 22 and (7) vacuuming the by-product matter from the CVD chamber the flowing N2. 24.

As described above, it is also understood that the method 12 of manufacture may, but not necessarily further include the steps of: adjusting the temperature in the CVD chamber 26; transporting reactant coating gases for coating the stainless steel substrate into the CVD chamber 28; allowing the surface reaction of the reactant coating gases on the stainless steel substrate thereby creating the coating byproducts 30; and removing the coating byproducts from the chamber via a CVD outlet which is in fluid communication with a vacuum 32.

It is understood that the step 18 of transporting gaseous nitrogen (N2) and tantalum chloride (TaCl5) into the CVD chamber for at least two cycles may, but not necessarily, occur with a cycle time lasting for 0.5 seconds on and 2.0 seconds off. The number of cycles may, but not necessarily exceed 200 cycles at the aforementioned rate. It is understood that the step 18 of transporting gaseous nitrogen and tantalum chloride into the CVD chamber may occur for at least two cycles occurs with a cycle time falling in a cycle range of about 0.5 seconds to about 2.0 seconds on and about 2.0 seconds to about 5.0 seconds off.

Moreover, the step 16 of heating the stainless steel substrate may include heating the stainless steel substrate to a substrate temperature which fails in a substrate temperature range of about 400 degrees Celsius to about 500 degrees Celsius. It is understood that the step of reacting the tantalum chloride and the chromium(III) oxide and creating by-products 22 may involve the following reaction: $TaCl_{5(g)} + Cr_2O_{3(s)} \rightarrow TaO_xCl_{y(g)} + CrO_xCl_{y(g)} +$ other volatile species. The flowing nitrogen gas may be used as the carrier gas to remove the byproducts and the other volatile species from the CVD chamber.

Figure 2:
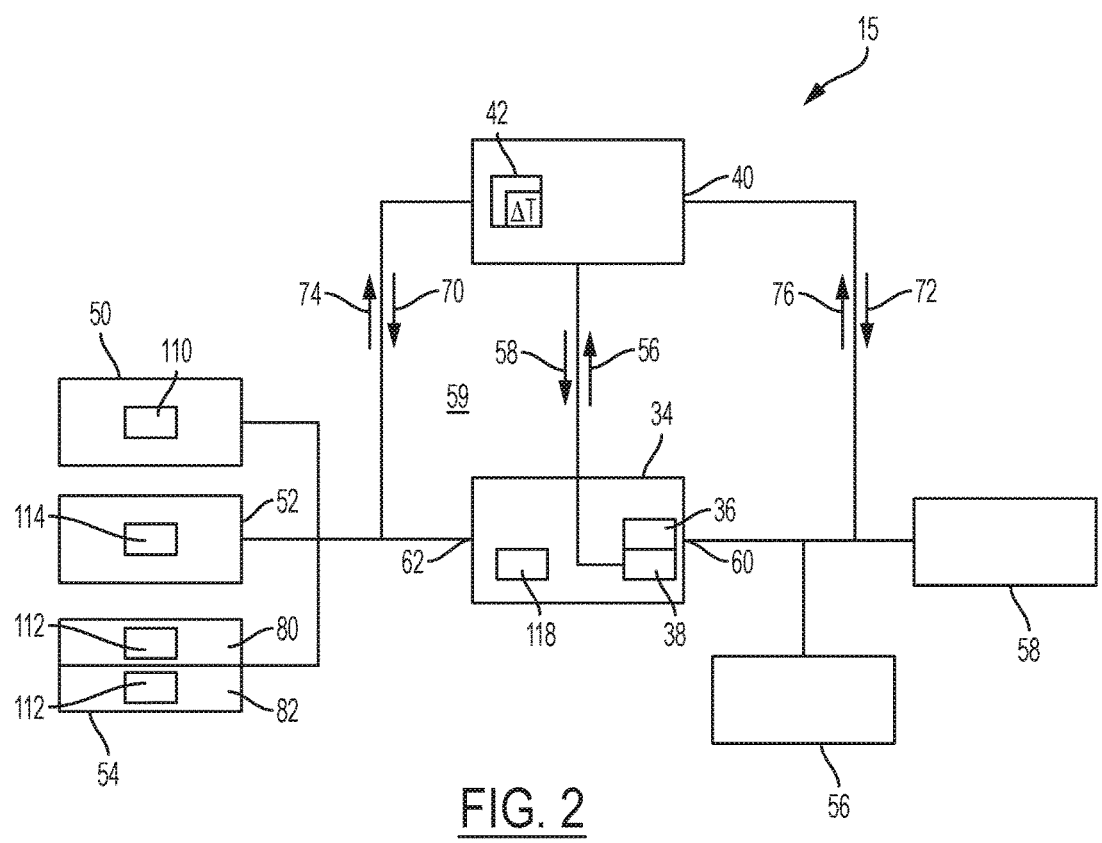
FIG. 2 is a schematic drawing for the manufacturing system for the present disclosure.

As shown in FIG. 2, the present disclosure therefore contemplates a manufacturing system 15 that cleans and coats the stainless steel substrate 10 within a single chamber 34. Thus, the system 15 for manufacturing a coated substrate may include a CVD chamber 34, a heat source 38, a temperature sensor 36 and a control module 40. The CVD chamber 34 is operatively configured to house the heat source 38, the temperature sensor 36 and a substrate 10 (shown in FIG. 1A), The temperature sensor 36 may be operatively configured to determine the temperature in the substrate while in the CVD chamber 34 via at least one temperature reading signal 56. The temperature sensor 36 and the heat source 38 may be in communication with a control module 40 which implements a model 42.

Accordingly, the system 15 for manufacturing a stainless steel substrate 10 may include: a CVD chamber 34 operatively configured to receive a stainless steel substrate 10; a heat source 38 and a temperature sensor 36, a control module 40, a tantalum chloride tank 50 and a coating reactant tank 54. The heat source 38 and the temperature sensor 36 may be disposed within the CVD chamber 34. The control module 40 may be in communication with the heat source 38 and the temperature sensor 36. The tantalum chloride tank 50 and the coating reactant tank 54 may be in fluid communication with the CVD chamber 34. The tantalum chloride tank 50 and the coating reactant tank 54 may also be in communication with the control module 40.

It is understood the system 15 may further comprise a vacuum 56 and a byproduct tank 58 in fluid communication with the CVD chamber 34 via an outlet 60. Moreover, the tantalum chloride tank 50 and a coating reactant tank 54 may be in fluid communication with the CVD chamber 34 via an inlet 62. The control module 40 is operatively configured to: (1) actuate the transportation of tantalum chloride (TaCl5) 110 into the CVD chamber 34 at a predetermined rate and cycle at a predetermined temperature; (2) actuate the transportation of gaseous coating reactants 112 into the CVD chamber 34; and (3) actuate the removal of byproducts 118 from the CVD chamber 34. The predetermined rate and cycle may, but not necessarily, occur with a cycle time lasting for 0.5 seconds on and 2.0 seconds off. The number of cycles may, but not necessarily exceed 200 cycles at the aforementioned rate. The predetermined temperature may fall in a range of about 400 degrees Celsius to 500 degrees Celsius. It is understood that the predetermined temperature may also, but not necessarily, falls in a preferred range of about 430 degrees Celsius to about 450 degrees Celsius.

It is further understood that the control module 40 may be configured to actuate the tantalum chloride tank 50, nitrogen tank 52, and/or the coating reactant tank 54 via an actuation signal 70 in order to implement the transportation of tantalum chloride 110, nitrogen 114, and/or coating reactants 112 into the CVD chamber 34. The control module 40 may also be configured to determine the status of the tantalum chloride tank 50, and the coating reactant tank 54 via a status signal 74. Also, the control module 40 may be configured to: (1) actuate the vacuum 56 via a vacuum actuation signal 72; (2) determine the status of the vacuum 56 via a vacuum status signal 76; (3) determine the status of the coating reactant tank 54 via a status signal 76. The coating reactant tank may but not necessarily be further comprised of a Titanium Chloride (TiCl$_4$) vessel 80 and a NH$_3$ vessel 82 such that each of the aforementioned vessels may be two separate tanks. The system 15 of the present disclosure includes the control module 40 being is in communication with a nitrogen tank 52 wherein the control module 40 is configured to actuate the nitrogen tank 52 via the actuation signal 70. The nitrogen 114 may function as a carrier gas 114 to create a fluid flow into and out of the CVD chamber 34 wherein the nitrogen 114 carries the byproducts 116 from the cleaning reaction as previously described. The control module 40 may also be operatively configured to adjust the heat source 38 based on at least one temperature reading signal 56 from the heat source 38 via a temperature adjustment signal 58.

Therefore, the control module 40 may be operatively configured to: (1) actuate the transportation of gaseous nitrogen ($N_2$) 114 and tantalum chloride ($TaCl_5$) 110 into the CVD chamber 34 at a predetermined rate and cycle as previously described; (2) actuate the transportation of gaseous coating reactants 112 into the CVD chamber 34; (3) actuate the removal of byproducts 118 from the CVD chamber 34. The control module 40 may therefore be operatively configured to communicate with the heat source 38 in order to implement the cleaning as well as the coating of the stainless steel substrate in a single chamber 34. In each of the aforementioned examples, non-limiting embodiments for the system 15 (FIG. 2) and method 12 (FIG. 3) of the present disclosure, it is understood that the substrate is formed from stainless steel.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing the exemplary embodiment or exemplary embodiments. It should be understood that various changes can be made in the function and arrangement of elements without departing from the scope of the disclosure as set forth in the appended claims and the legal equivalents thereof.

What is claimed is:

1. A method for manufacturing a corrosion resistant substrate, the method comprising the steps of:

inserting a stainless steel substrate with a chromium(III) oxide layer inside a CVD chamber;

heating the stainless steel substrate to a temperature which falls in the range of about 400 to about 500 degrees Celsius;

transporting gaseous nitrogen (N2) and tantalum chloride (TaCl5) into the CVD chamber for at least two cycles wherein each cycle in the at least two cycles is further defined by the steps of turning on the transportation of gaseous nitrogen and tantalum chloride for a specific time period and then turning off the transportation of gaseous nitrogen and tantalum chloride for another specific time period;

ceasing the transportation of tantalum chloride (TaCl5) while nitrogen continues to flow from an inlet to an outlet;

reacting the tantalum chloride and the chromium(III) oxide and creating by-products; and vacuuming a by-product matter from the CVD chamber via a flow of gaseous nitrogen (N2) exiting the CVD chamber.

2. The method of manufacture as defined in claim 1 further comprising the steps of:

adjusting the temperature in the CVD;

transporting reactant gases for coating the stainless steel substrate into the CVD chamber;

allowing the surface reaction of the reactant gases on the stainless steel substrate thereby creating coating byproducts; and removing the coating byproducts from the chamber via a CVD outlet which is in fluid communication with a vacuum.

3. The method of manufacture as defined in claim 1 wherein the step of transporting gaseous nitrogen and tantalum chloride into the CVD chamber for at least two cycles occurs with a cycle time falling in a cycle range of about 0.5 seconds to about 2.0 seconds on and about 2.0 seconds to about 5.0 seconds off.

4. The method of manufacture as defined in claim 3 wherein step of heating the stainless steel substrate includes heating the stainless steel substrate to a substrate temperature which falls in a substrate temperature range of about 400 degrees Celsius to about 500 degrees Celsius.

* * * * *